(12) United States Patent
Luo et al.

(10) Patent No.: US 11,217,483 B2
(45) Date of Patent: Jan. 4, 2022

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Kang Luo, Shanghai (CN); Jun Wang, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/743,554

(22) Filed: Jan. 15, 2020

(65) Prior Publication Data

US 2020/0243394 A1 Jul. 30, 2020

(30) Foreign Application Priority Data

Jan. 28, 2019 (CN) .......................... 201910080124.8

(51) Int. Cl.
| | | |
|---|---|---|
| *H01L 21/8234* | (2006.01) | |
| *H01L 29/08* | (2006.01) | |
| *H01L 29/78* | (2006.01) | |
| *H01L 27/088* | (2006.01) | |
| *H01L 21/306* | (2006.01) | |
| *H01L 21/3065* | (2006.01) | |
| *H01L 21/308* | (2006.01) | |

(52) U.S. Cl.
CPC ........ *H01L 21/823425* (2013.01); *H01L 21/823481* (2013.01); *H01L 27/088* (2013.01); *H01L 29/0847* (2013.01); *H01L 29/7848* (2013.01); *H01L 21/3065* (2013.01); *H01L 21/3081* (2013.01); *H01L 21/30604* (2013.01)

(58) Field of Classification Search
CPC ..... H01L 21/823425; H01L 21/823481; H01L 27/088
See application file for complete search history.

(56) References Cited

U.S. PATENT DOCUMENTS

2014/0312430 A1* 10/2014 Kim ............... H01L 21/823425
257/401

* cited by examiner

*Primary Examiner* — Errol V Fernandes
(74) *Attorney, Agent, or Firm* — Anova Law Group, PLLC

(57) ABSTRACT

Semiconductor structure and fabrication method are provided. The method includes: providing a substrate, and the substrate includes isolation structures; forming a first gate structure on the substrate; forming a first opening and a second opening at two sides of the first gate structure respectively, where the first opening is disposed between the first gate structure and the isolation structures, and at least a portion of sidewalls of the first opening exposes sidewalls of the isolation structure; performing a surface treatment on surface of inner walls of the first opening; and forming epitaxial layers in the first opening and in the second opening respectively, after the surface treatment.

14 Claims, 7 Drawing Sheets

SEMICONDUCTOR STRUCTURE AND FABRICATION METHOD THEREOF

CROSS-REFERENCES TO RELATED APPLICATION

This application claims the priority of Chinese Patent Application No. 201910080124.8, filed on Jan. 28, 2019, the content of which is incorporated herein by reference in its entirety.

TECHNICAL FIELD

The present disclosure generally relates to the field of semiconductor technology and, more particularly, relates to a semiconductor structure and its fabrication method.

BACKGROUND

In a complementary metal-oxide-semiconductor (CMOS) fabrication technology, embedded SiGe is used to form sources and drains, thereby exerting stress on channels, to enhance strains in the channels of transistors and mobility of carriers. Performance of P-type metal-oxide-semiconductor (PMOS) transistors is improved. To achieve a better improvement, before epitaxially growing SiGe on the sources or drains, recesses are formed by etching. Recesses with Σ shape are formed by etching and SiGe is epitaxially grown in the recesses with Σ shape to enhance the effect of applying strain and improved the performance of the semiconductor structure.

However, volumes of the epitaxially grown SiGe are inhomogeneous. Correspondingly, transistors at different positions have different electric performance.

There is a need to provide a semiconductor structure with uniform performance. The disclosed methods and semiconductor structures are directed to solve one or more problems set forth above and other problems in the art.

SUMMARY

One aspect of the present disclosure provides a fabrication method for a semiconductor structure. The method includes: providing a substrate, wherein the substrate includes isolation structures; forming a first gate structure on the substrate; forming a first opening and a second opening at two sides of the first gate structure respectively, where the first opening is disposed between the first gate structure and the isolation structures, and at least a portion of sidewalls of the first opening exposes sidewalls of the isolation structure; performing a surface treatment on surface of inner walls of the first opening; and forming epitaxial layers in the first opening and in the second opening respectively, after the surface treatment.

Another aspect of the present disclosure provides a semiconductor structure. The semiconductor structure includes: a substrate; isolation structures on the substrate; a first gate structure and a second gate structure on the substrate; first barrier layers on sidewalls of the first gate structure; and a first epitaxial layer and a second epitaxial layer in the substrate at two sides of the first barrier layers and the first gate structure.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
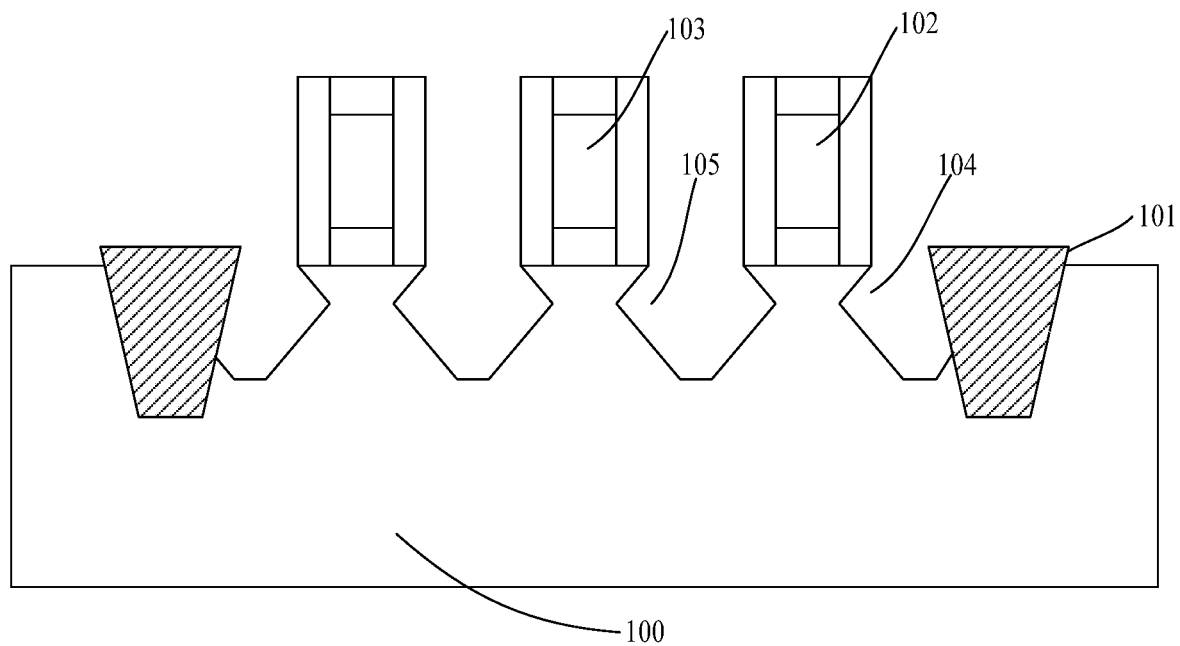
FIGS. 1-2 illustrate semiconductor structures corresponding to certain stages for forming a transistor.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width and depth should be considered during practical fabrication.

In a semiconductor structure, volumes of the epitaxially grown SiGe are inhomogeneous. Correspondingly, transistors at different positions have different electric performance.

Figure 2:
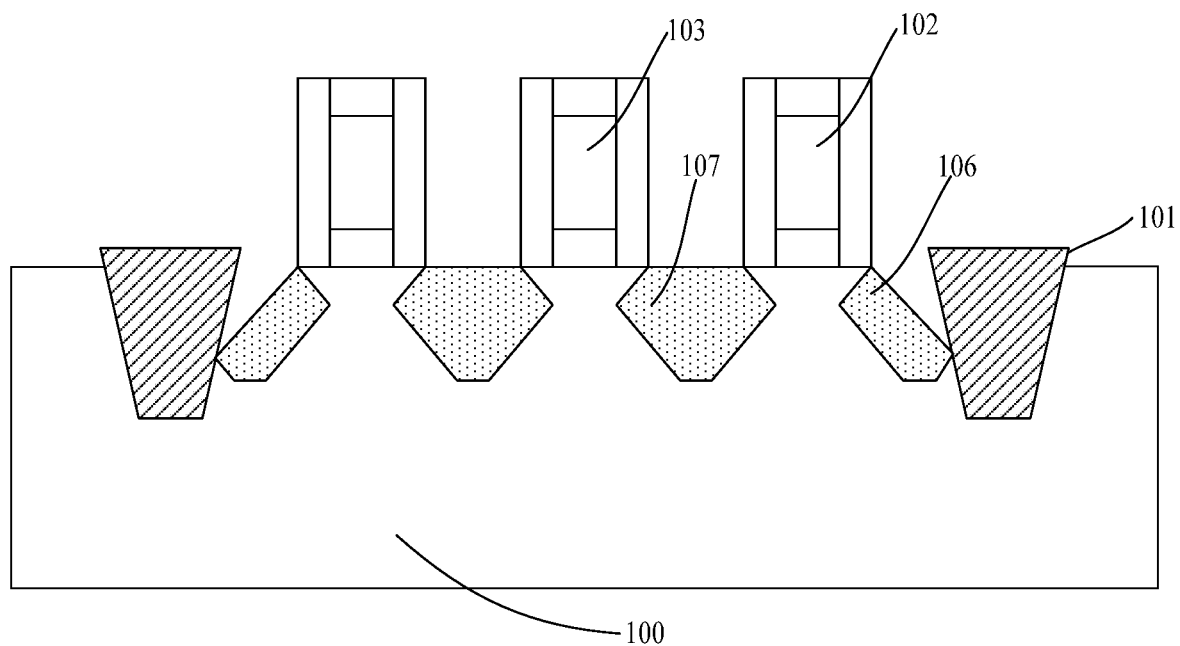

FIGS. 1-2 illustrate semiconductor structures corresponding to certain stages for forming a transistor.

As illustrated in FIG. 1, a substrate 100 may be provided. An isolation structure 101 may be formed in the substrate 100. A first gate structure 102 and a second gate structure 103 may be formed on the substrate 100. A first opening 104 with shape and a second opening 105 with Σ shape may be formed in the substrate 100 at two sides of the first gate structure 102 respectively. The first opening 104 may be formed in the substrate 100 between the isolation structure 101 and the first gate structure 102, and sidewalk of the first opening 104 may expose a portion of sidewalls of the isolation structure 101. The second opening 105 may be located between the first gate structure 102 and the second gate structure 103.

As illustrated in FIG. 2, a first epitaxial layer 106 may be formed in the first opening 104, and a second epitaxial layer 107 may be formed in the second opening 105. There may be a gap between the first epitaxial layer 106 and the isolation structure 101.

The substrate 100 may include a trap area, and the trap area may be doped with N-type ions. The isolation structure 101 may be made of a material including $SiO_2$.

In the above process, the first opening 104 with Σ shape and the second opening 105 with Σ shape may be formed in the substrate 100 at two sides of the first gate structure 102 respectively, and SiGe may be epitaxially grown in the first opening 104 and the second opening 105. The isolation structure 101 may be formed in the substrate 100 before and may be filled with $SiO_2$. When forming the first opening 104, at least a portion of the sidewalls of the isolation structure 101 may be exposed. After forming the first opening 104, sides and bottom of the first opening 104 may be (111) crystalline planes. The growth of SiGe may be selective, and a growth rate of SiGe on the (111) crystal planes may be small. Correspondingly, the volume of SiGe may be small. There is a gap between the SiGe and the isolation structure 101, and the SiGe may exert a small stress strain on a channel. Mobility of carriers on sides of the gate structure and then the performance of devices may be affected. Correspondingly, transistors at different positions may have different electric performance.

The present disclosure provides a semiconductor structure and fabrication method thereof to at least partially resolved above problems. In the fabrication method, after forming first openings in a substrate and before epitaxial growth processes, surfaces of the first openings may be treated to modify states of atomic surfaces. Correspondingly, surfaces of inner walls of the first openings may be better for growth of epitaxial layers and volume of the epitaxial layers may be increased. Stress strain exerted on channels by the epitaxial layers may be increased, and difference between electrical performance of transistors at different positions may be reduced.

FIGS. 3-11 illustrate semiconductor structures corresponding to certain stages for forming an exemplary semiconductor structure consistent with various disclosed embodiments of the present disclosure.

Figure 3:
FIGS. 3-11 illustrate semiconductor structures corresponding to certain stages for forming an exemplary semiconductor structure consistent with various disclosed embodiments of the present disclosure.
Figure 12:
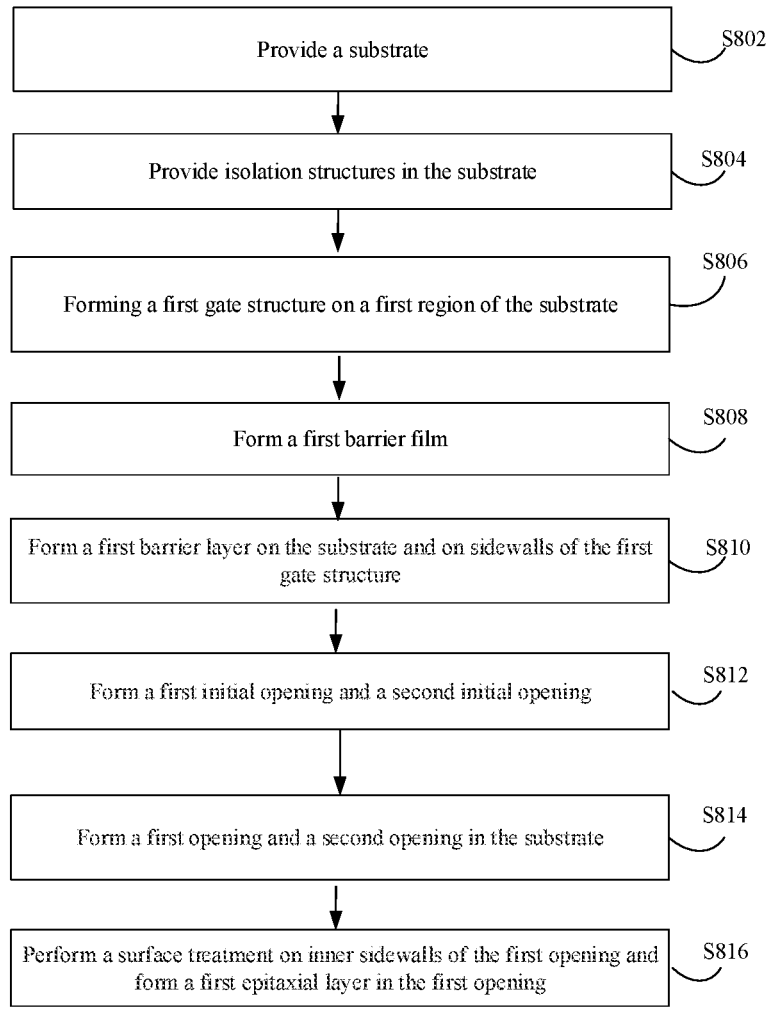
FIG. 12 illustrates an exemplary method for forming a semiconductor structure according to various disclosed embodiments of the present disclosure.

As illustrated in FIG. 3, a substrate 200 may be provided (S802 in FIG. 12).

In one embodiment, well regions may be formed in the substrate 200 by an ion implantation process.

The substrate 200 may be a silicon substrate. In other embodiments, the substrate 200 may be a silicon-germanium substrate, a SiC substrate, a silicon-on-insulator substrate, a germanium-on-insulator substrate, a glass substrate, or an III-V compound substrate (such as a GaN substrate or a GaAs substrate).

In one embodiment, the substrate 200 may include a first region 210 and a second region 220. The second region 220 may be adjacent to the first region 210. The first region 210 may be used to form a PMOS transistor, and the second region 220 may be used to form an NMOS transistor. The well regions including a well region in the first region 210 and a well region in the second region 220 may be doped with doping ions. The well region in the first region 210 may be doped with N-type doping ions, and the well region in the second region 220 may be doped with P-type doping ions.

The well region in the first region 210 may be formed by forming the well region in the first region 210 by an ion implantation process.

The well region in the second region 220 may be formed by forming the well region in the second region 220 by an ion implantation process.

Figure 4:
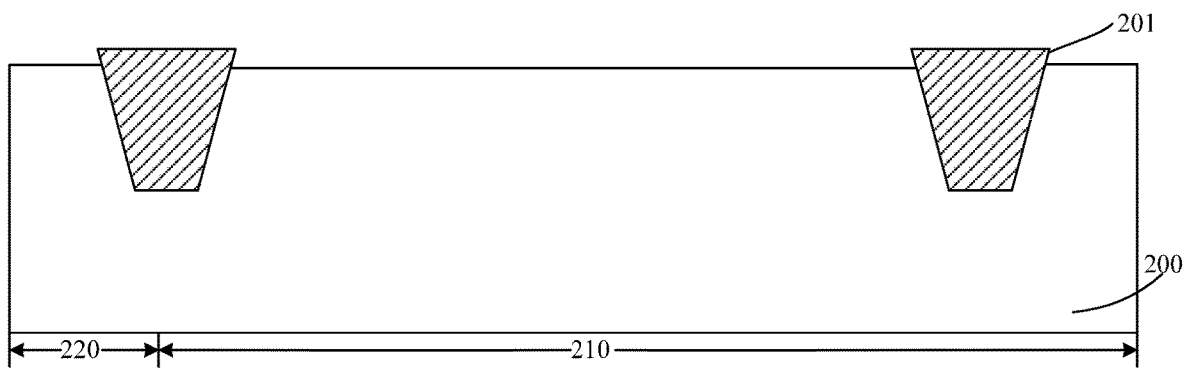

As illustrated in FIG. 4, isolation structures 201 may be formed in the substrate 200 (S804 in FIG. 12).

In one embodiment, after forming the well regions in the first region 210 and the second region 220, the isolation structure 201 may be formed in the substrate 200. In some other embodiment, before forming the well regions in the first region 210 and the second region 220, the isolation structure 201 may be formed in the substrate 200.

In one embodiment, the isolation structures 201 may be disposed in the substrate 200 between the adjacent first region 210 and second region 220, to separate the well region in the first region 210 from the well region in the adjacent second region 220. Inter-diffusion of the N-type ions in the well region in the first region 210 and the P-type ions in the well region in the adjacent second region 220, may be avoided, which facilitates stable performance of the PMOS transistor in the first region 210 and the NMOS transistor in the second region 220.

The isolation structures 201 may be formed by: forming a first pattern layer on a surface of the substrate 200 to expose areas corresponding to the isolation structures 201 which will be formed; etching the substrate by an anisotropic dry etching process using the first pattern layer as a mask, to form isolation grooves in the substrate 200; removing the first pattern layer after the anisotropic dry etching process; and forming an initial isolation layer by a chemical vapor deposition method, to cover the isolation grooves and the surface of the substrate 200; polishing and thinning the surface of the substrate 200 by a chemical mechanical polishing process, to form the isolation structures 201.

The first pattern layer may be a patterned photoresist layer. The initial isolation layer may be made of a material including $SiO_2$.

Figure 5:
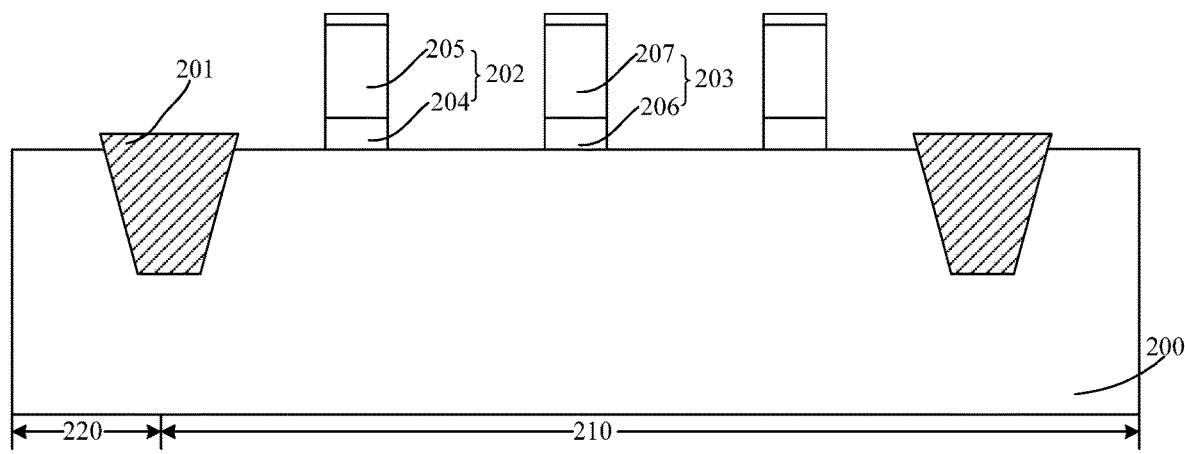

As illustrated in FIG. 5, a first gate structure 202 may be formed on the first region 201 of the substrate 200 (S806 in FIG. 12).

In one embodiment, the method may further include forming a second gate structure 203 on the first region 201 of the substrate 200. The second gate structure 203 may be adjacent to the first gate structure 202.

The first gate structure 202 may include: a first gate dielectric layer 204 and a first gate electrode layer 205 on the first gate dielectric layer 204.

The second gate structure 203 may include: a second gate dielectric layer 206 and a second gate electrode layer 207 on the second gate dielectric layer 206.

The first gate structure 202 and the second gate structure 203 may be formed by: forming a gate dielectric film on the substrate 200; forming a gate electrode film on the gate dielectric film; forming a second pattern layer on the gate electrode film; and etching the gate dielectric film and the gate electrode film by using the second pattern layer as a mask, to form the first gate structure 202 and the second gate structure 203.

In one embodiment, the first gate dielectric layer may be formed on the substrate 200 before forming the isolation structure 201.

In one embodiment, the gate dielectric film may be made of a material including $SiO_2$. The gate dielectric film may be formed by an in-situ water vapor process. In other embodiments, the gate dielectric film may be made of high-k dielectric material. The high-k dielectric material may be a material with a dielectric constant k larger than 3.9. The high-k dielectric material may include $HfO_2$.

The gate electrode film may be formed on the substrate 200 and on the gate dielectric film. The second pattern layer may be formed on the gate electrode film and may expose a portion of the gate electrode film. The gate electrode film and the gate dielectric film may be etched by using the second pattern layer as a mask, until exposing the substrate, to form the first gate structure 202 and the second gate structure 203.

The gate electrode film may be made of a material including amorphous silicon and may be formed by a chemical vapor deposition process or a physical vapor deposition process.

The second pattern layer may be made of a material including $SiN_x$, and may be used as the mask to form the first gate structure 202 and the second gate structure 203.

The gate dielectric film and the gate electrode film may be etched by a dry etching process, a wet etching process, or a combination thereof, by using the second pattern layer as the mask.

As illustrated in FIGS. 6-10, after forming the first gate structure 202 and the second gate structure 203, a first opening 213 and a second opening 214 may be formed at two sides of the first gate structure 202 respectively.

Figure 6:
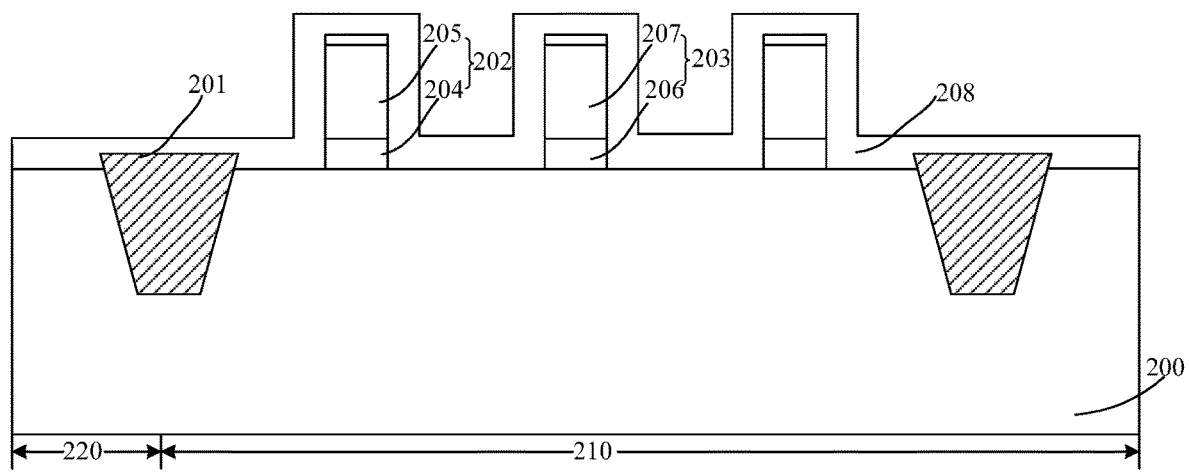

As illustrated in FIG. 6, a first barrier film 208 may be formed on the substrate 200, on sidewalls of the first gate structure 202, and a top surface of the first gate structure 202 (S808 in FIG. 12).

The first barrier film 208 may be formed by a deposition process including a plasma chemical vapor deposition process, an atomic layer deposition process, or a low-pressure chemical vapor deposition process.

The first barrier film 208 may be made of a material including $SiN_x$.

Along a direction perpendicular to the sidewalls of the first gate structure 202, a size of the first barrier film 208 on the sidewalls of the first gate structure 202 may be about 70 Å to about 200 Å.

The first barrier film 208 on the sidewalls of the first gate structure 202 may be used to form a first barrier layer.

Figure 7:
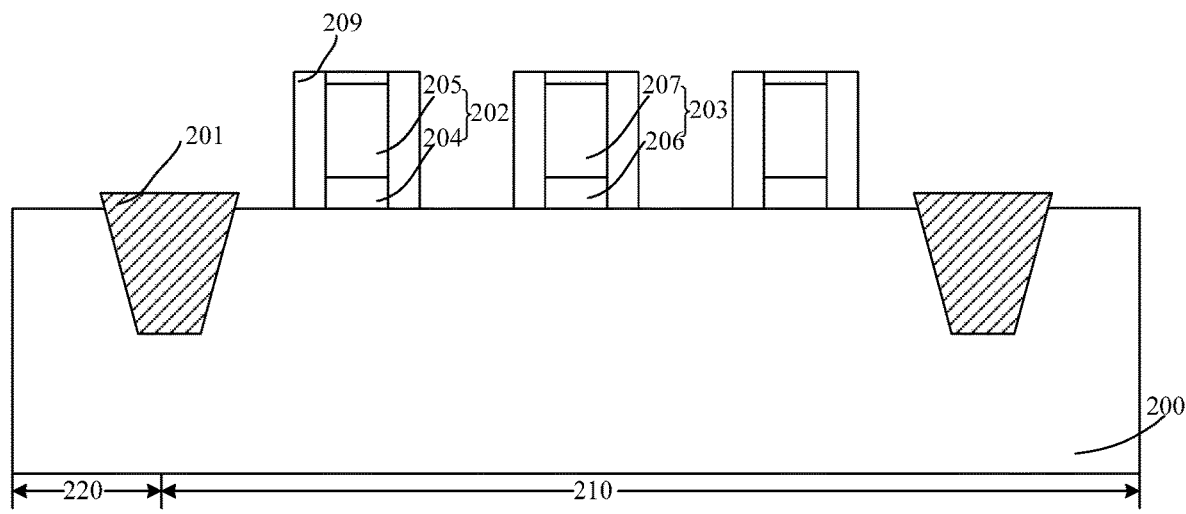

As illustrated in FIG. 7, a first barrier layer 209 may be formed on the substrate 200, and on the sidewalls of the first gate structure 202 (S810 in FIG. 12).

The first barrier film 208 on the first gate structure 202, and a portion of the first barrier film 208 on the substrate 200, may be removed to expose the surface of the substrate and to form the first barrier layer 209 on the sidewalls of the first gate structure 202.

The first barrier film 208 on the first gate structure 202 and a portion of the first barrier film 208 on the substrate 200 may be removed by an anisotropic dry etching process.

Along the direction perpendicular to the sidewalls of the first gate structure 202, a size of the first barrier layer 209 on the sidewalls of the first gate structure 202 may be about 70 Å to about 200 Å.

If the size of the first barrier layer 209 along the direction perpendicular to the sidewalls of the first gate structure 202 is smaller than 70 Å, a top of the first gate structure 202 may be exposed easily when treating surfaces of the openings after forming the openings. When forming epitaxial layers in the openings, the epitaxial layers may be also formed on an exposed portion of the top of the first gate structure 202, and the performance of the formed semiconductor structure may be affected. If the size of the first barrier layer 209 along the direction perpendicular to the sidewalls of the first gate structure 202 is larger than 200 Å, a distance between the openings formed in the substrate 200 at sides of the first gate structure 202 may be large, and stress strain exerted by the epitaxial layers in the openings may be small, and the performance of the transistors may not be improved.

Figure 8:
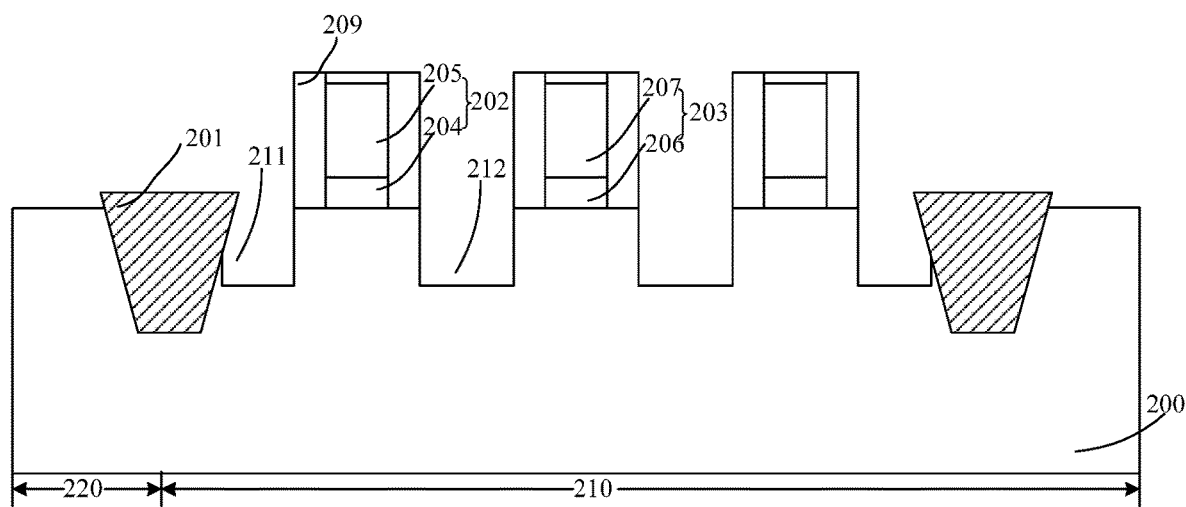

As illustrated in FIG. 8, a first initial opening 211 and a second initial opening 212 may be formed in the substrate 200 at the sides of the first gate structure 202 (S812 in FIG. 12).

The first initial opening 211 may be disposed in the substrate 200 between the first gate structure 202 and an adjacent isolation structure 201. Sidewalls of the first initial opening 211 may expose a portion of the sidewalls of the adjacent isolation structure 201. The second initial opening 212 may be disposed between the first gate structure 202 and the second gate structure 203.

The first initial opening 211 may be formed by: etching the substrate 200 at the sides of the first gate structure 202 by using the first barrier layer 209 as a mask, to form the first initial opening 211 in the substrate 200 between the first gate structure 202 and an adjacent isolation structure 201.

The second initial opening 212 may be formed by: etching the substrate 200 at the sides of the first gate structure 202 by using the first barrier layer 209 as a mask, to form the second initial opening 212 in the substrate 200 between the first gate structure 202 and the second gate structure 203.

The first initial opening may be formed by an anisotropic dry etching process. The anisotropic dry etching process may use: an etching gas including HBr with a flow of about 400 standard mL/minute to about 500 standard mL/minute and $Cl_2$ with a flow of about 30 standard mL/minute to about 60 standard mL/minute, a pressure of about 30 mTorr to about 50 mTorr, a radio frequency power of about 300 W to about 600 W, a temperature of about 40° C. to about 80° C., and a bias voltage of about 50 V to about 150 V. $Cl_2$ is used as a buffer gas.

The second initial opening may be formed by an anisotropic dry etching process. The anisotropic dry etching process may use: an etching gas including HBr with a flow of about 400 standard mL/minute to about 500 standard mL/minute and $Cl_2$ with a flow of about 30 standard mL/minute to about 60 standard mL/minute, a pressure of about 30 mTorr to about 50 mTorr, a radio frequency power of about 300 W to about 600 W, a temperature of about 40° C. to about 80° C., and a bias voltage of about 50 V to about 150 V. $Cl_2$ is used as a buffer gas.

Depth of the first initial opening 211 and the second initial opening 212 may be determined according to requirements of the semiconductor fabrication process. In one embodiment, the depth of the first initial opening 211 and the second initial opening 212 may be about 600 Å to about 900 Å.

The first initial opening 211 may be used to form a first opening subsequently.

The second initial opening 212 may be used to form a second opening subsequently.

Position of sidewalls of the first barrier layer 209 may determine position of top edges of an opening formed in the substrate 200 at sides of the first barrier layer 209 and the first gate structure 202.

Figure 9:
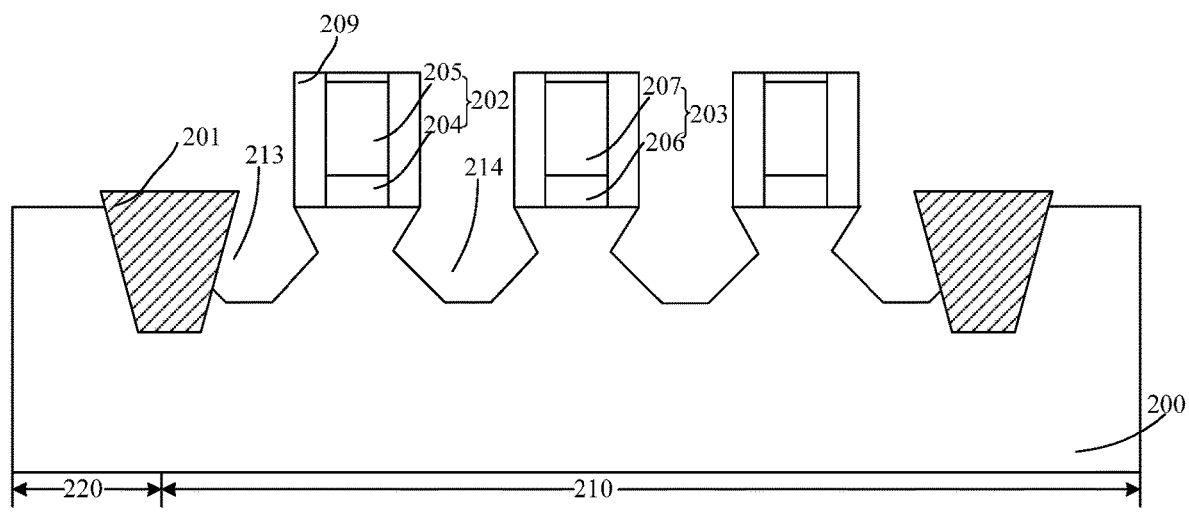

As illustrated in FIG. 9, a first opening 213 and a second opening 214 may be formed in the substrate 200 at the sides of the first gate structure 202 (S814 in FIG. 12).

In one embodiment, the first opening 213 and the second opening 214 may be formed in the substrate 200 at the sides of the first barrier layer 209 and the first gate structure 202, by using the first barrier layer 209 and the first gate structure 202 as a mask.

Sidewalls of the first opening 213 and the second opening 214 may have apex angles that may extend into the substrate 200 below the first gate structure 202.

The sidewalls of the first opening 213 and the second opening 214 and the surface of the substrate 200 may form Σ shape. The first opening 213 may expose at least a portion of the sidewalls of the isolation structures 201. An inner wall of the first opening 213 may be a (111) crystalline plane.

The first opening 213 and the second opening 214 may be formed by a wet etching process. The wet etching process may use an etching chemical including an organic base or an inorganic base. The organic base may include tetramethylammonium hydroxide (TMAH). The inorganic base may include sodium hydroxide or potassium hydroxide.

Figure 10:
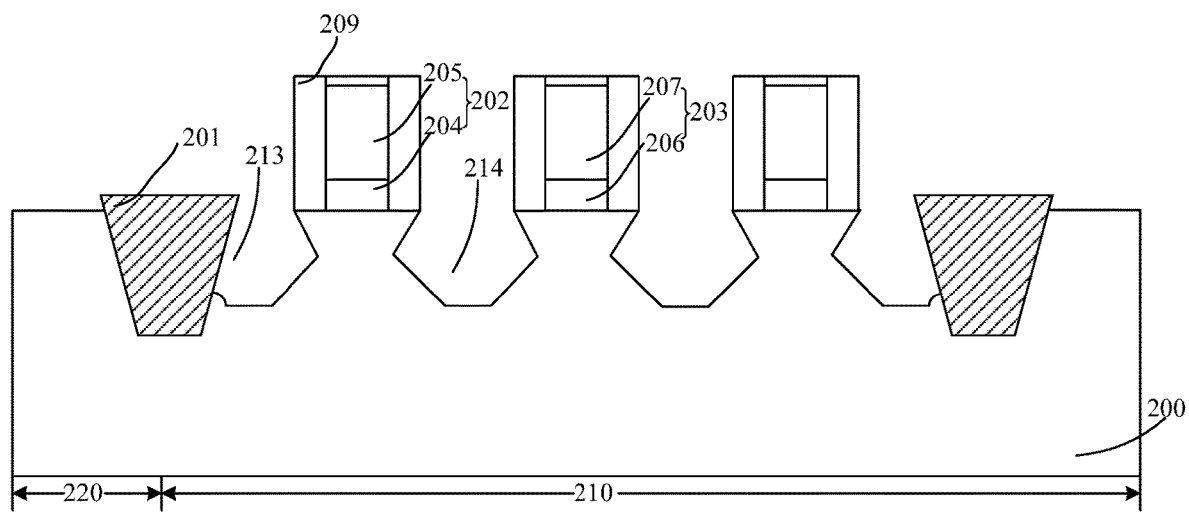

As illustrated in FIG. 10, surfaces of the inner sidewalls of the first opening 213 may be treated (S816 in FIG. 12).

After forming the first opening 213 and the second opening 214, the surfaces of the inner sidewalls of the first opening 213 may be treated, to form non-(111) crystalline plane on the surface of the inner sidewalls of the first opening 213.

The surfaces of the inner sidewalls of the first opening 213 may be treated by a dry etching process. The dry etching process may use: an gas including a halogen gas such as $Cl_2$ with a flow of about 50 standard mL/minute to about 150 standard mL/minute, a pressure of about 10 mTorr to about 200 mTorr, a radio frequency power of about 200 W to about 1000 W, and a bias voltage of about 30 V to about 200 V.

Before treating the surfaces of the inner sidewalls of the first opening 213, the inner sidewalls of the first opening 213 may be the (111) crystalline plane. When growing the epitaxial layers in the first opening 213 and the second opening 214, the growth of the epitaxial layers may be selective, and it may be hard to grow the epitaxial layers on the (111) crystalline planes of the first opening 213. The growth of the epitaxial layers may have a small speed, and the epitaxial layers may have small volume. Correspondingly, there may be gaps between the epaxial layer and the isolation structures 201. The epitaxial layers may exert a small stress strain on a channel. Mobility of carriers on sides of the first gate structure 202 and then the performance of devices may be affected. In the present disclosure, after treating the surfaces of the inner sidewalls of the first opening 213 by the dry etching process, the (111) crystalline planes may be damaged, and an atomic density may be reduced. The growth of the epitaxial layers may be facilitated, and the growth rate may be enhanced. The size of the epitaxial layers may be increased and the stress strain extended on channels by the epitaxial layers may be increased. The mobility of carriers on sides of the first gate structure 202 may be improved and the difference between electrical performance of transistors at different positions may be reduced.

In the dry etching process, if the flow of the gas is smaller than 50 standard mL/minute, the (111) crystalline planes on the inner sidewalls of the openings may not be damaged when treating the surfaces of the inner sidewalls of the openings. The size of the epitaxial layers may not be increased when form the epitaxial layers in the openings, and the performance of the semiconductor structure may not be improved. If the flow of the gas is larger than 150 standard mL/minute, the inner sidewalls of the openings may be etched too much when treating the surfaces of the inner sidewalls of the openings, the apex angles of the openings may be recessed toward the channel, and a distance between the top of the openings to the channel may be too small. A short channel effect may easily happen after forming the epitaxial layers in the openings. The performance of the transistors may be affected.

Figure 11:
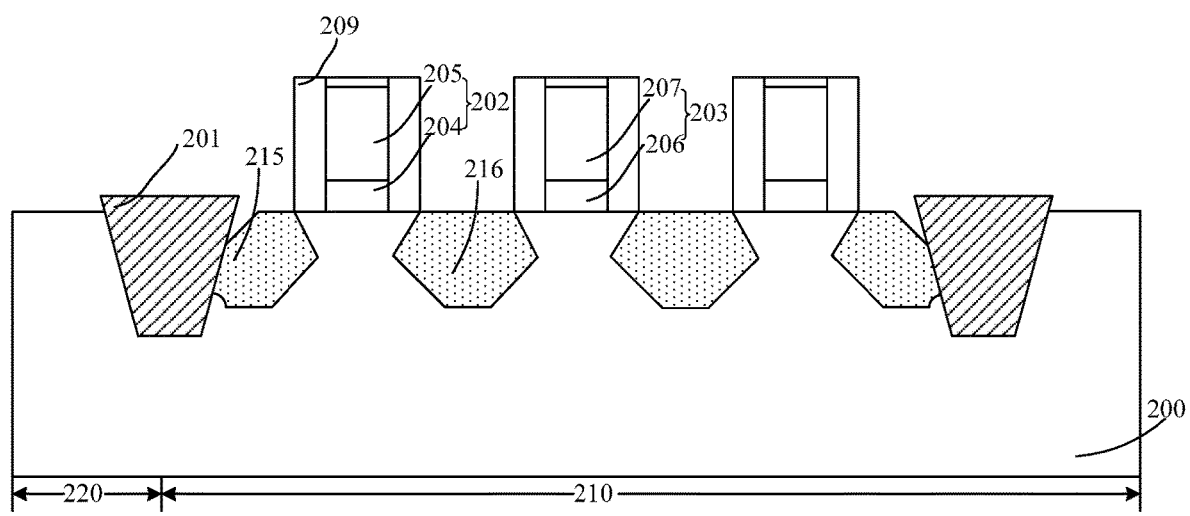

As illustrated in FIG. 11, a first epitaxial layer 215 may be epitaxially grown in the first opening 213, and a second epitaxial layer 216 may be epitaxially grown in the second opening 214.

The first epitaxial layer 215 and the second epitaxial layer 216 may be made of a material including SiGe.

After the surfaces of the inner sidewalls of the first opening 213 are treated by the dry etching process, a volume of SiGe epitaxially grown in the first opening 213 may increase, and a gap between the first epitaxial layer and the isolation structures 201 may be reduced. Correspondingly, a difference between the volume of the first epitaxial layer 215 and the second epitaxial layer 216 at two sides of the first gate structure 202 respectively may be reduced, and the stress strain exerted by the first epitaxial layer 215 and the second epitaxial layer 216 may be same. The mobility of the carriers at two sides of the first gate structure 202 may be improved and a difference between the performance of the transistors at different positions may be reduced.

In the present disclosure, after forming the first opening 213 and the second opening 214, the surfaces of the inner sidewalls of the first opening 213 may be treated. The (111) crystalline plane in the first opening 213 may be damaged and the atomic density may be reduced. Correspondingly, the epitaxial growth of the epitaxial layer may be facilitated, and the growth speed may be improved. The volume of the epitaxial layer may be increased and the stress strain exerted by the epitaxial layer on the channels may be increased. The mobility of the carriers at two sides of the first gate structure 202 may be improved and a difference between the performance of the transistors at different positions may be reduced to improve the performance of the transistors.

The present disclosure also provides a semiconductor structure formed by the fabrication method provided by various embodiments of the present disclosure. As illustrated in FIG. 11, the semiconductor structure may include: a substrate 200, isolation structures 201 on the substrate 200, a first gate structure 202 and a second gate structure 203 on the substrate 200, a first barrier layer 209 on sidewalls of the first gate structure 202, a first epitaxial layer 215 and a second epitaxial layer 216 in the substrate 200 at sides of the first gate structure 202 and the first barrier layer 209 respectively.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments but may be embodied in other equivalent forms without departing from the scope of the present disclosure, which is determined by the appended claims.

What is claimed is:

1. A fabrication method for a semiconductor structure, comprising:
   providing a substrate, and isolation structures in the substrate;
   forming a first gate structure on the substrate;
   forming first barrier layers on sidewalls of the first gate structure;
   forming a first initial opening and a second initial opening at two sides of the first gate structure respectively by an anisotropic dry etching process using the first barrier layer as a first mask, wherein the first initial opening is disposed between the first gate structure and the isolation structures, and at least a portion of sidewalls of the first initial opening exposes sidewalls of the isolation structure;

forming a first opening and a second opening in the first initial opening and the second initial opening, respectively, by an isotropic wet etching process using the first barrier layer and the first gate structure as a second mask;

performing a surface treatment on surfaces of inner walls of the first opening after the isotropic wet etching process; and forming epitaxial layers in the first opening and in the second opening respectively, after the surface treatment.

2. The method according to claim 1, wherein:
at least a portion of the surfaces of the inner walls of the first opening includes (111) crystalline planes.

3. The method according to claim 2, wherein:
the sidewalls of the first opening and a surface of the substrate form a Σ shape.

4. The method according to claim 3, wherein:
sidewalls of the second opening and a surface of the substrate form a Σ shape.

5. The method according to claim 2, wherein:
the surface treatment reduces the (111) crystalline planes in the inner walls of the first opening.

6. The method according to claim 5, wherein:
the surface treatment includes a dry etching process.

7. The method according to claim 6, wherein:
the dry etching process uses: an gas including a halogen gas, the halogen gas including $Cl_2$ with a flow of about 50 standard mL/minute to about 150 standard mL/minute, a pressure of about 10 mTorr to about 200 mTorr, a radio frequency power of about 200 W to about 1000 W, and a bias voltage of about 30 V to about 200 V.

8. The method according to claim 1, wherein:
the first barrier layers are made of a material including $SiN_x$.

9. The method according to claim 1, wherein:
a thickness of the first barrier layers is about 70 Å to about 200 Å.

10. The method according to claim 1, wherein:
the substrate includes a first region and a second region; and
the first gate structure is disposed on the substrate in the first region.

11. The method according to claim 10, wherein:
forming the first barrier layers includes: forming a first barrier film on the substrate; and
etching back a portion of the first barrier film in the first region until exposing the surface of the substrate, to form the first barrier layers, wherein the first barrier film is formed by a vapor deposition process.

12. The method according to claim 1, further including:
forming a second gate structure on the substrate, wherein the second gate structure is adjacent to the first gate structure and the second opening is disposed in the substrate between the first gate structure and the adjacent second gate structure.

13. The method according to claim 1, wherein the epitaxial layers are made of a material including SiGe.

14. The method according to claim 1, wherein the surface treatment reduces the volume difference between the volumes of the epitaxial layers at two sides of the first gate structure.

* * * * *